United States Patent [19]

Shimada

[11] Patent Number: 5,289,487
[45] Date of Patent: Feb. 22, 1994

[54] SEMICONDUCTOR LASER DEVICE HAVING UNIFORM AND REPRODUCIBLE LASER CHARACTERISTICS

[75] Inventor: Naohiro Shimada, Kawasaki, Japan

[73] Assignee: Kabushiki Kaisha Toshiba, Kawasaki, Japan

[21] Appl. No.: 856,763

[22] Filed: Mar. 24, 1992

[30] Foreign Application Priority Data

Mar. 25, 1991 [JP] Japan .................................. 3-084678

[51] Int. Cl.⁵ ................................................ H01S 3/19
[52] U.S. Cl. .......................................... 372/46; 372/45
[58] Field of Search ............................. 372/46, 45, 44

[56] References Cited

U.S. PATENT DOCUMENTS 4,910,744  3/1990  Yoshida et al. ...................... 372/46
4,949,352  8/1990  Plumb ................................ 372/46

*Primary Examiner*—James W. Davie
*Attorney, Agent, or Firm*—Finnegan, Henderson, Farabow, Garrett & Dunner

[57] ABSTRACT

An optical waveguide layer formed on a semiconductor substrate is etched to form two parallel grooves, thereby obtaining a low ridge having a relatively small height along the longitudinal direction of the grooves. Thereafter, a current blocking layer and a third cladding layer are formed. For this reason, the dimensions such as the height and width of the ridge can be controlled with high precision, and crystal growth for the current blocking layer can be relatively easily performed. Therefore, crystal defects are not concentrated near the ridge, and laser characteristic values fall within a sufficiently allowable range which cannot be obtained by the conventional laser device. A reliable laser device capable of obtaining desired laser characteristics with excellent uniformity and reproducibility can be obtained.

14 Claims, 11 Drawing Sheets

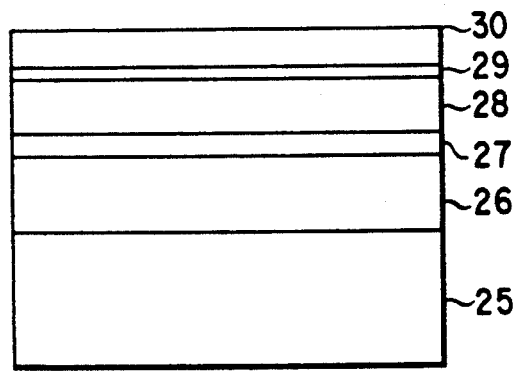
F I G. 4A
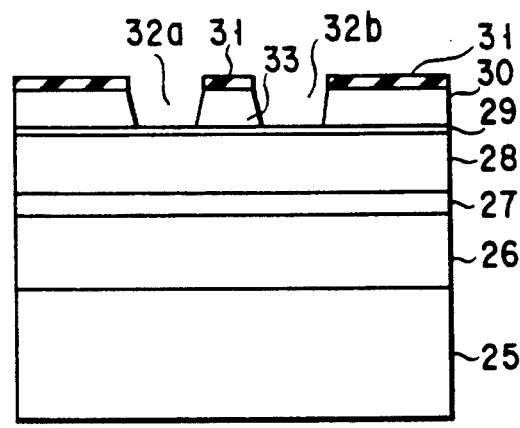
F I G. 4B
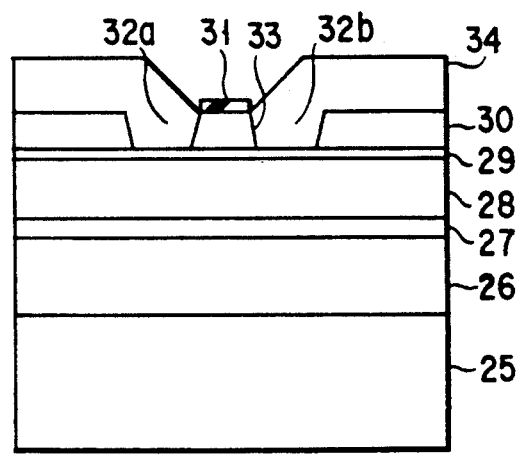
F I G. 4C

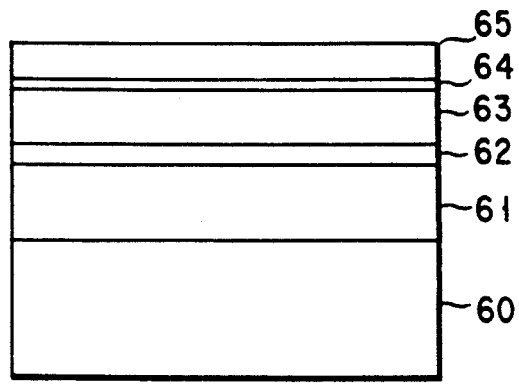
F I G. 7A
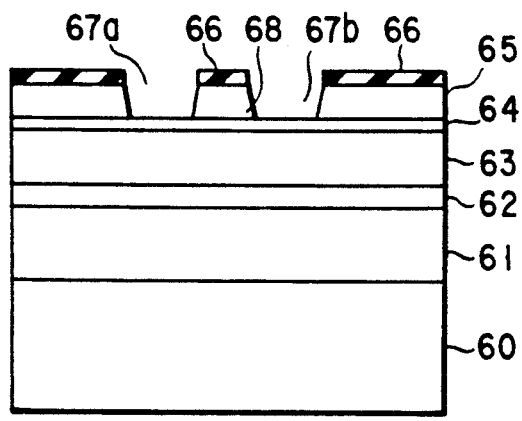
F I G. 7B

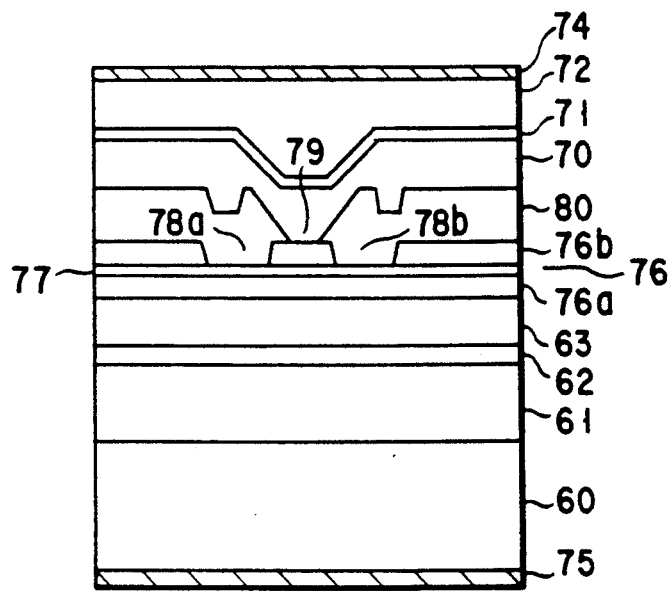
F I G. 9
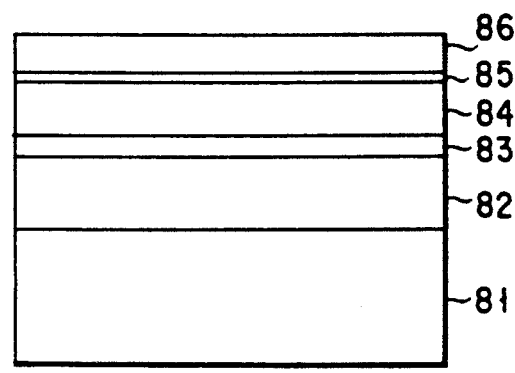
F I G. 10A
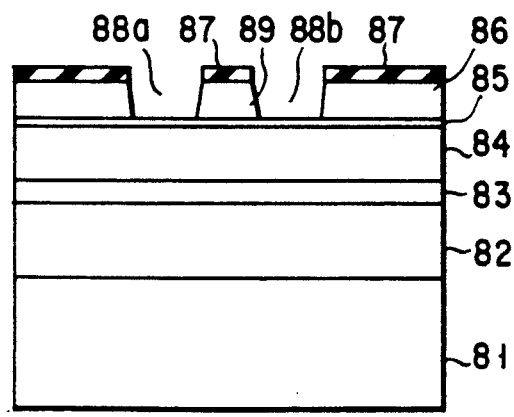
F I G. 10B

SEMICONDUCTOR LASER DEVICE HAVING UNIFORM AND REPRODUCIBLE LASER CHARACTERISTICS

BACKGROUND OF THE INVENTION

1. Field of the Invention

The present invention relates to an index guided semiconductor laser device and a method of manufacturing the same.

2. Description of the Related Art

In recent years, the development of a semiconductor laser device has remarkably advanced. For example, a conventional He-Ne gas laser can be replaced with an InGaAlP laser, and the InGaAlP laser can be used in various applications. The InGaAlP laser attracts a great deal of attention as a key device for obtaining high performance of each equipment. Under these circumstances, an index guided semiconductor laser device is used as a light source of an optical disk system, a laser printer, or the like.

A conventional SBR (Selectively Buried Ridge Waveguide) laser will be described below with reference to FIGS. 1 to 3 showing an ridge-stripe type SBR laser.

FIG. 1 is a sectional view showing a laser device of the first prior art. In FIG. 1, reference numeral 1 denotes an n-type GaAs semiconductor substrate; 2, a first cladding layer; 3, $In_{0.5}(Ga_{1-x}Al_x)_{0.5}P$ active layer; 4, a second cladding layer; 5, a stripe-like ridge formed on a portion of the upper surface of the second cladding layer 4; 6, a current blocking layer formed on the second cladding layer 4 except for the upper surface of the ridge 5; 7, an intermediate layer formed on the upper surface of the ridge 5; 8, a contact layer; and 9 and 10, electrodes. The steps in manufacturing the laser device are described as follows. The above layers were sequentially and continuously and epitaxially grown by a low-pressure MOCVD method using a source gas having the elements for constituting the above layers as their compositions. A portion of the upper surface of the second cladding layer 4 was chemically etched to form the stripe-like ridge 5 on the portion of the upper surface of the second cladding layer 4. Thereafter, the current blocking layer 6 was formed on an etched portion of the second cladding layer 4, and the contact layer 8 was grown on the current blocking layer 6 and the intermediate layer 7, such that the electrodes 9 and 10 were formed on the upper surface of the contact layer 8 and the lower surface of the semiconductor substrate 1, respectively.

In the steps of etching the upper surface of the second cladding layer 4 and forming the stripe-like ridge 5 at a portion of the second cladding layer 4, since the area of the etched portion is considerably larger than that of the remaining portion, the dimensions such as the height and width of the ridge 5 cannot be easily controlled with high precision. This is because a new etchant cannot be exchanged for an old etchant smoothly on the surface of the crystal becauses of a large etching area. That is, since the upper surface of the second square cladding layer 4 having a side of 300 μm is etched to leave the ridge 5 having a width of about 5 μm and a height of about 0.8 to 1.0 μm, the dimensions of the ridge are varied within a range of about 10 to 20%.

Upon etching the second cladding layer, when the current blocking layer 6 is to be formed on the upper surface of the second cladding layer 4 to bury the ridge 5, a crystal is not easily grown near the ridge 5 due to the large height of the ridge 5. For this reason, a crystal which can be grown to a level allowed in terms of characteristics is limited to GaAs. However, when GaAs is subjected to epitaxially growth, since the height of the ridge 5 is too large, the GaAs is grown in different plane directions near the ridge 5. In this portion, crystal defects of the current blocking layer 6 easily occur.

In addition, in the laser having the above arrangement, laser characteristics such as a threshold current, temperature characteristics, or astigmatism are influenced by the width of the ridge 5 and the thickness of the etched portion of the second cladding layer 4. Therefore, the laser characteristics and the distribution of the laser characteristics in the wafer surface are varied by variations in width of the ridge 5 and thickness of the second cladding layer 4 upon the etching operation, and a transverse mode cannot easily be controlled. Furthermore, in the portion in which the ridge 5 is buried, i.e., in the current blocking layer 6 near the ridge 5, crystallinity of this portion largely influences reliability of the laser. Therefore, in this laser device, crystal defects are easily concentrated, and a failure rate is easily increased to cause degradation of the reliability of the laser device.

Since the current blocking layer 6 must be made of GaAs, the band gap of the active layer 3 is larger than that of the current blocking layer 6, and the structure of this laser is limited to a loss guided structure. Therefore, characteristic improvements, e.g., a decrease in threshold current, improvement of temperature characteristics, or a decrease in astigmatism are limited.

FIG. 2 is a sectional view showing a laser device according to the second prior art. In this prior art, unlike in the above first prior art, the laser device is arranged to have an arrangement which can withstand against optical feedback noise to be applied to an optical disk system. In FIG. 2, reference numeral 11 denotes an n-type GaAs semiconductor substrate; 12, a first cladding layer; 13, an $In_{0.5}(Ga_{1-x}Al_x)_{0.5}P$ active layer; 14, a second cladding layer; 15, a stripe-like ridge formed on a portion of the upper surface of the second cladding layer 14; 16, a current blocking layer formed on the second cladding layer 14 to leave a stripe-like upper intermediate portion of the ridge 15 in the longitudinal direction; 17, an intermediate layer formed on the upper surface of the ridge 5; 19, a contact layer; and 20 and 21, electrodes. Note that a conductive region 22 is formed by the stripe-like portion left on the upper intermediate portion of the ridge 15. The steps in manufacturing the above laser will be described below. As in the first prior art, the above layers were continuously grown on the upper surface of the semiconductor substrate 11, and the upper surface of the second cladding layer 14 was etched to form the stripe-like ridge 15 on a portion of the upper surface of the second cladding layer 14. Thereafter, the current blocking layer 16 was grown on the second cladding layer 14 to leave a stripe-like upper intermediate portion of the ridge 15 in the longitudinal direction. That is, the current blocking layer 16 was formed on the edge portions of the ridge 15 along the longitudinal direction and on the etched portion of the second cladding layer 14. In addition, the contact layer 19 were grown, and the electrodes 20 and 21 were formed on the upper surface of the contact layer 19 and the lower surface of the semiconductor substrate 11, respectively.

In the above steps in manufacturing the conventional laser device, as in the first prior art, in the step of forming the ridge 15, since the area of a portion to be etched is considerably larger than that of the remaining portion, the dimensions such as the height and width of the ridge 15 cannot be easily controlled with high precision. In addition, when the current blocking layer 16 is formed on the upper surface of the second cladding layer 14 upon the etching operation to bury the edge portions of the ridge 15 so as to form the conductive region 22, the height of the ridge 15 is high, i.e., 0.5 μm or more, and a crystal is not easily grown near the ridge 15. Therefore, a crystal which can be grown to a level allowed in terms of characteristics is limited to GaAs. In this case, crystal defects are easily concentrated on the crystal of the current blocking layer 16 near the ridge 15.

In the laser having the above arrangement, laser characteristics such as a threshold current, temperature characteristics, or astigmatism are influenced by the width of the ridge 15, the thickness of the etched portion of the second cladding layer 14, and the width of the conductive region 22. Optical feedback noise characteristics are influenced by these dimensions. Therefore, the laser characteristics and the distribution of the laser characteristics in one wafer are varied by etching precision. The etching operation must be controlled with high precision to obtain desired laser characteristics. In addition, since crystal defects are easily concentrated on a portion of the current blocking layer 16 near the ridge 15, and a failure rate is easily increased, the reliability of the laser may be degraded.

Since the current blocking layer 16 must be made of GaAs, the band gap of the active layer 13 is larger than that of the current blocking layer 16. As in the first prior art, the structure of this laser is limited to a loss guided structure. Therefore, characteristic improvements, e.g., a decrease in threshold current of the laser characteristics, improvement of temperature characteristics, or a decrease in astigmatism are limited. In addition, a laser device having small optical feedback noise cannot be easily obtained at a high yield with excellent reproducibility.

FIG. 3 is a sectional view showing a laser device according to the third prior art. In this prior art, as in the second prior art, the laser is arranged to have an arrangement which can withstand against optical feedback noise. However, unlike the laser device of the second prior art, in the laser device of the third prior art, a laser device having a short oscillation wavelength is used to be applied to an optical disk having a higher recording density. In FIG. 3, reference numeral 111 denotes an n-type GaAs semiconductor substrate, the plane direction of the upper surface of the semiconductor substrate is inclined from directions (0,0,1) to [1,1,0] by, e.g., 15° C. Reference numeral 112 denotes a second cladding layer; 113, an $In_{0.5}(Ga_{1-x}Al_x)0.5P$ activelayer; 114, a second cladding layer; 115, a stripe-like ridge formed on a portion of the upper surface of the second cladding layer 114; 116, a current blocking layer formed on the second cladding layer 114 to leave a stripe-like upper intermediate portion of the ridge 115 in the longitudinal direction; 117, an intermediate layer formed on the upper surface of the ridge 115; 119, a contact layer; and 120 and 121, electrodes. Note that a conductive region 122 is formed by the stripe-like portion left on the upper intermediate portion of the ridge 115. In the steps in manufacturing the above laser, the above layers were continuously grown on the upper surface of the semiconductor substrate 111 having a plane direction inclined from directions (0,0,1) to [1,1,0] in the same manner as described in the second prior art, and the stripe-like ridge 115 and the like were formed.

In this prior art, in addition to the same problems as described in the second prior art, the following problem is posed. When the ridge 115 having a large height is formed by an etching operation using, e.g., a phosphoric acid enchant, in the step of forming the ridge 115, the ridge 115 has an asymmetrical shape in the right-and-left direction because the semiconductor substrate 111 is inclined. For this reason, since refractive index distribution having a direction parallel to the active layer 113 becomes asymmetrical, a transverse mode is set to be unstable by an increase in optical output, i.e., an increase in injection current. As a result, a characteristic curve representing current vs. optical output characteristics is kinked, and a far field pattern (FFP) is changed.

SUMMARY OF THE INVENTION

The present invention has been made in consideration of the circumstances in which the above desired laser characteristics cannot easily be obtained and the reliability thereof may be degraded, and has as its object to provide a semiconductor laser device and a method of manufacturing the same in which desired laser characteristics can be obtained with good uniformity and reproducibility by precisely forming a ridge and improving crystallinity of a current blocking layer near the ridge, thereby improving reliability of the laser device.

According to the present invention, there is provided a semiconductor laser device comprising: a semiconductor substrate of a first conductivity type; a first cladding layer of the first conductivity type, an active layer, and a second cladding layer of a second conductivity type which are sequentially formed on the semiconductor substrate of the first conductivity type; an optical waveguide layer of the second conductivity type formed on an upper surface of the second cladding layer of the second conductivity type; a stripe-like ridge formed by forming two parallel grooves in the optical waveguide layer of the second conductivity type; a current blocking layer of the first conductivity type formed in the grooves and on an upper surface of the optical waveguide layer of the second conductivity type except for an upper surface of the ridge; and a third cladding layer formed on the current blocking layer of the first conductivity type and the upper surface of the ridge.

According to the present invention, there is also provided a semiconductor laser device comprising: a semiconductor substrate of a first conductivity type; a first cladding layer of the first conductivity type, an active layer, and a second cladding layer of a second conductivity type which are sequentially formed on the semiconductor substrate of the first conductivity type; an optical waveguide layer of the second conductivity type formed on an upper surface of the second cladding layer of the second conductivity type; a stripe-like ridge formed by forming two parallel grooves in the optical waveguide layer of the second conductivity type; a current blocking layer of the first conductivity type formed in the grooves and on an upper surface of the optical waveguide layer of the second conductive layer except for a stripe-like upper intermediate portion of the upper surface of the ridge along the longitudinal direction of the ridge; and a third cladding layer of the second conductivity type formed on the current blocking layer of the first conductivity type and on the upper intermediate portion of the ridge.

According to the present invention, there is further provided a method of manufacturing a semiconductor laser device comprising the steps of: forming at least a first cladding layer of a first conductivity type, an active layer, a second cladding layer of a second conductivity type, and an optical waveguide layer of the second conductivity type on a semiconductor substrate of the first conductivity type; forming two parallel stripe-like grooves in an upper surface of the optical wave-guide layer of the second conductivity type by an etching operation to form a stripe-like ridge; forming a current blocking layer of the first conductivity type in the grooves and on the upper surface of the optical waveguide layer of the second conductivity type except for at least a portion of the upper surface of the ridge; and forming a third cladding layer of the second conductivity type on the left portion of the ridge and on the upper surface of the current blocking layer of the first conductivity type.

According to the above semiconductor laser device and the method of manufacturing the same, when a ridge serving as an optical waveguide is to be formed, two parallel grooves each having a small width are formed in the optical waveguide layer of the second conductivity type along the longitudinal direction thereof by an etching operation. The ridge having a relatively small height can be formed by forming the two grooves, and then the current blocking layer of the first conductivity type and the third cladding layer of the second conductivity type are formed. For this reason, the dimensions such as the height and width of the ridge can be controlled with high precision. In addition, since the height of the ridge is small, the ridge can be relatively easily buried by epitaxibly growing the current blocking layer of the first conductivity type after the etching operation, and crystal defects are not concentrated near the ridge. Laser characteristic values fall within a sufficiently allowable range, and the reliability of the laser device can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a sectional view showing the first step of the first embodiment of the present invention;

FIG. 4B is a sectional view showing the second step of the first embodiment of the present invention;

FIG. 4C is a sectional view showing the third step of the first embodiment of the present invention;

FIG. 7A is a sectional view showing the first step of the fourth embodiment of the present invention;

FIG. 7B is a sectional view showing the second step of the fourth embodiment of the present invention;

FIG. 9 is a sectional view showing a semiconductor laser device according to the fifth embodiment of the present invention;

FIG. 10A is a sectional view showing the first step of the sixth embodiment of the present invention;

FIG. 10B is a sectional view showing the second step of the sixth embodiment of the present invention;

DETAILED DESCRIPTION OF THE PREFERRED EMBODIMENTS

Figure 1:
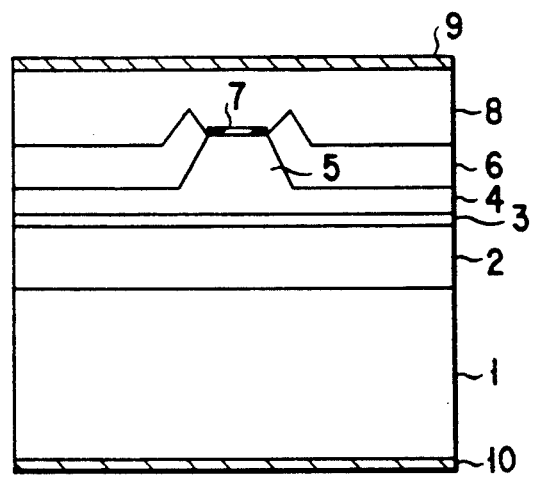
FIG. 1 is a sectional view showing a laser device according to the first prior art.
Figure 2:
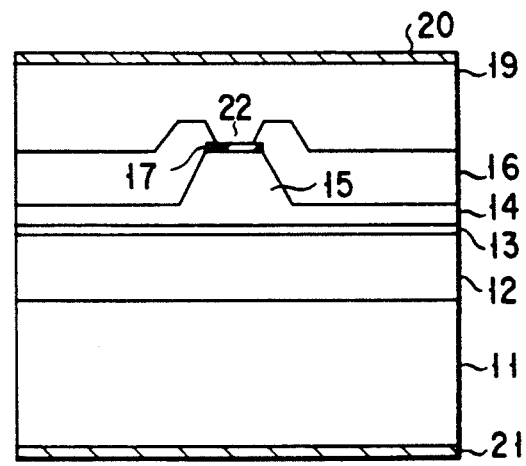
FIG. 2 is a sectional view showing a laser device according to the second prior art.
Figure 3:
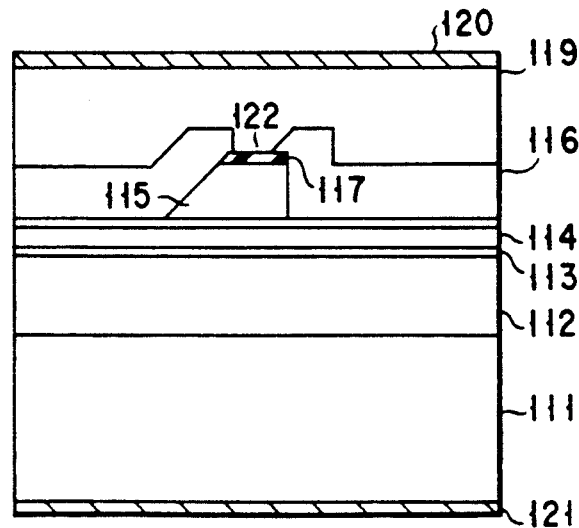
FIG. 3 is a sectional view showing a laser device according to the third prior art.

Embodiments of index guided semiconductor laser devices and methods of manufacturing the same according to the present invention will be described below in detail.

The first embodiment of the present invention will be described below with reference to FIGS. 4A to 4E. FIGS. 4A to 4D are sectional views showing the steps in manufacturing a semiconductor laser device according to the first embodiment of the present invention in an order of manufacturing steps.

According to the first embodiment, in the first step shown in FIG. 4A, Group III organic metals, e.g., trimethyl indium (($CH_3)_3In$), trimethyl gallium (($CH_3)_3Ga$), and trimethyl aluminum (($CH_3)_3Al$), and Group V hydride, e.g., hosphine ($PH_3$) were used as source gases, and a pressure was decreased to be lower than the atmospheric pressure. In this state, on the surface having the plane direction (0,0,1) of an n-type GaAs semiconductor substrate 25, an n-type $In_{0.5}(Ga_{0.3}Al_{0.7})_{0.5}P$ first cladding layer 26 having a thickness of 0.8 µm, an undoped $In_{0.5}(Ga_{1-x}Al_x)_{0.5}P$ active layer 27 having a thickness of 0.03 µm, a p-type $In_{0.5}(Ga_{0.3}Al_{0.7})_{0.5}P$ second cladding layer 28 having a thickness of 0.2 µm, a p-type $In_{0.5}Ga_{0.5}P$ stopper layer 29 having a thickness of 0.01 µm, and a p-type $In_{0.5}(Ga_{1-y}Al_y)_{0.5}P$ optical waveguide layer 30 having a thickness of 0.15 µm were sequentially grown by an MOCVD method while the amounts of the source gases were controlled. In the above description, the values x and y can be properly set within a range of $0 \le x < y < 1$, the value x can be normally set to be about 0 to 0.1, and the value y can be normally set to be about 0.2 to 0.4. In this embodiment, the values x and y were set as follows: $x=0.1$ and $y=0.4$. In the present invention, the thickness of the optical waveguide layer 30 was set to be 0.3 µm or less.

In the second step shown in FIG. 4B, an $SiO_2$ film 31 in which two stripe-like slits each having a width of 6 µm were formed at a 2-µm interval was formed on the upper surface of the p-type waveguide layer 30 formed in the first step, and the p-type optical waveguide layer 30 was selectively removed by a chemical etching operation using this $SiO_2$ film 31 as a mask to expose the p-type stopper layer 29. Therefore, a stripe-like ridge 33 having a width of 2 µm was formed on the p-type optical waveguide layer 30, and two stripe-like grooves 32a and 32b each having a width of 6 µm were formed on both the sides of the ridge 33. Note that FIG. 4E is a plan view showing the planar shape of the ridge 33 after the $SiO_2$ film 31 of the FIG. 4B is removed.

In the third step shown in FIG. 4C, the $SiO_2$ film 31 on the p-type waveguide layer 30 was removed to leave the $SiO_2$ film 31 on the ridge 33. Subsequently, by using a low-pressure MOCVD method using the same source gases as those of the step shown in FIG. 4A, an n-type $In_{0.5}(Ga_{0.3}Al_{0.7})_{0.5}P$ current blocking layer 34 having a thickness of 0.2 µm was epitaxially grown on the upper surface of the p-type optical waveguide layer 30 to bury the grooves 32a and 32b and to leave the $SiO_2$ film 31 on the ridge 33.

Figure 4D:
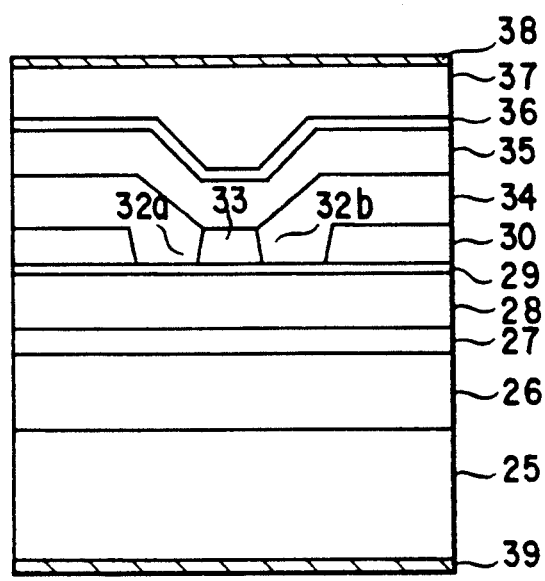
FIG. 4D is a sectional view showing the fourth step of the first embodiment of the present invention.
Figure 4E:
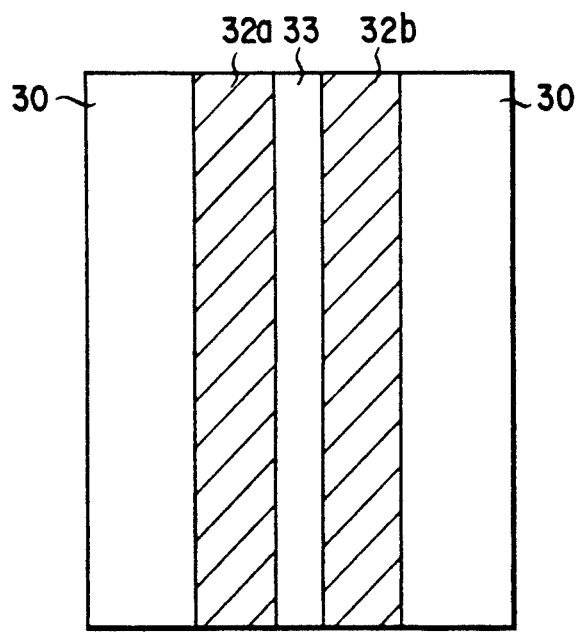
FIG. 4E is a plan view showing a state in which the $SiO_2$ film of FIG. 4B is removed.

In the fourth step shown in FIG. 4D, after the $SiO_2$ film 31 on the ridge 33 was removed, a p-type $In_{0.5}(Ga_{0.3}Al_{0.7})_{0.5}P$ third cladding layer 35 having a thickness of 0.9 µm and a p-type $In_{0.5}Ga_{0.5}P$ intermediate layer 36 having a thickness of 0.05 µm were epitaxially grown on the n-type current blocking layer 34 and the ridge 33 by the low pressure MOCVD method using the same source gases as those of the step shown in FIG. 4C. A p-type GaAs contact layer 37 having a thickness of 0.5 µm was epitaxially grown on the p-type intermediate layer 36 by a low pressure MOCVD method using trimethyl gallium and arsine ($AsH_3$) as source gases. A p-side electrode 38 and an n-side electrode 39 were formed on the upper surface of the p-type contact semiconductor he lower surface of the n-type semiconductor substrate 25 by deposition, respectively, thereby forming a laser wafer. In addition, a square laser having a side of 300 µm was obtained from the obtained wafer in which a cleavage surface having the (1,1,0) plane was used as a mirror surface.

In the laser device manufactured in the above steps, when the ridge 33 serving as an optical waveguide is to be formed, the p-type waveguide layer 30 is etched from both the slit-like sides of the ridge 33 along the longitudinal direction of the ridge 33. For this reason, the dimensions such as the height and width of the ridge 33 can be controlled with high precision. The thicknesses of the layers such as the p-type optical waveguide layer 30 can be controlled with high precision. In addition, since the height of the ridge 33 is small, the ridge 33 can be relatively easily buried by crystal-growing the n-type current blocking layer 34 upon the etching operation, and crystal defects are not concentrated near the ridge 33. Furthermore, since the n-type current blocking layer 34 is not made of GaAs but of a material (n-type $In_{0.5}(Ga_{0.3}Al_{0.7})_{0.5}P$) transparent to a laser beam, a real index guided structure is formed, and laser characteristic values can fall within a sufficiently allowable range.

According to the first embodiment, a laser beam having a wavelength of 670 nm band is oscillated at a threshold value of 25 mA, although a conventional laser-beam having a wavelength of 670 nm band is oscillated at a threshold current of 35 mA. In a conventional laser beam, a transverse mode having one peak can be maintained until an output becomes about 10 mW. However, according to the first embodiment, a transverse mode having one peak can be maintained until an output becomes 20 mW. In this embodiment, since the real index guided structure is used, a small astigmatism of 2 µm or less can be obtained, although a conventional astigmatism is 8 µm. In conventional temperature characteristics, a 10-mW optical output can be obtained at a temperature of 70° C. However, in the first embodiment, a 20-mW optical output can be obtained at a temperature of 70° C. In reliability, a failure rate of the laser device of the first embodiment is half a failure rate of a conventional laser device. In addition, according to the first embodiment, uniformity in the wafer surface and reproducibility of the processes are improved compared with those of a conventional laser device.

Figure 5:
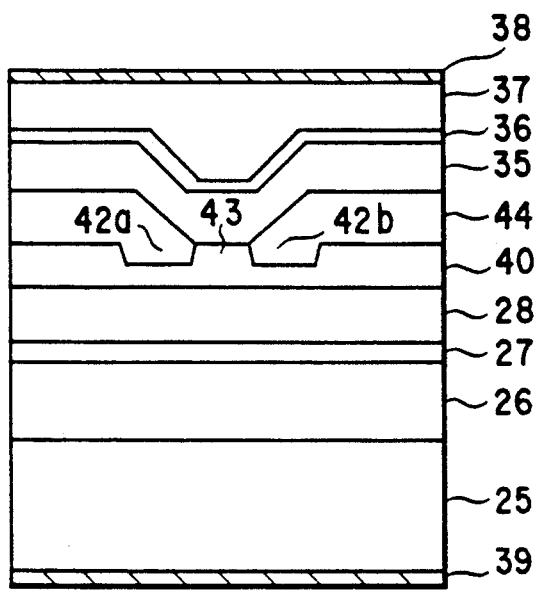
FIG. 5 is a sectional view showing a semiconductor laser device according to the second embodiment of the present invention.

FIG. 5 is a sectional view showing an index guided semiconductor laser device according to the second embodiment of the present invention. The second embodiment is different from the first embodiment by an arrangement of a ridge formed on an optical waveguide layer. The same reference numerals as in the first embodiment denote the same parts in the second embodiment. In FIG. 5, reference numeral 40 denotes a p-type optical waveguide layer having a thickness of 0.15 µm and the same composition as that in the first embodiment. An n-type first cladding layer 26, an undoped active layer 27 having a predetermined thickness, and a p-type cladding layer 28 were epitaxially grown on an n-type semiconductor substrate 25 in the same manner as that of the first embodiment, and the p-type waveguide layer 40 was formed on the upper surface of the p-type second cladding layer 28. A stripe-like ridge 43 having a width of 2 µm was formed on the p-type optical waveguide layer 40, and two stripe-like grooves 42a and 42b each having a width of 6 µm were formed on both the sides of the ridge 43. This ridge 43 was formed as follows. As in the step shown in FIG. 4B, a predetermined mask is formed on the upper surface of the p-type optical waveguide layer 40, and the p-type optical wave-guide layer 40 was etched from its upper surface at a predetermined depth reaching the p-type second cladding layer 28 while an etching amount was controlled in accordance with an etching time so as to form the grooves 42a and 42b. Note that the etching amount was controlled such that the ridge 43 serving as an optical waveguide had a step difference which could be formed to have an appropriate small refractive index difference, i.e., a step difference of 0.01 µm or more.

Thereafter, as in the steps of the first embodiment, an n-type current blocking layer 44 having a thickness of 0.2 μm and the same composition as that of the first embodiment was epitaxially grown on the upper surface of the p-type optical waveguide layer 40 on which the ridge 43 was formed and in which the grooves 42a and 42b were formed. The n-type current blocking layer 44 was not grown on the upper surface of the ridge 43. In addition, a p-type third cladding layer 35 and a p-type intermediate layer 36 were epitaxially grown on the n-type current blocking layer 44 and the ridge 43, a p-type contact layer 37 was epitaxially grown on the p-type intermediate layer 36, and a p-side electrode 38 and an n-side electrode 39 were formed by deposition. The resultant structure was left to obtain a square laser having a side of 300 μm.

In the second embodiment, since the ridge 43 is formed without using the p-type stopper layer of the first embodiment, the process for forming the p-type stopper layer 29 of the first embodiment can be omitted. In the second embodiment, the same function and effect as described in the first embodiment can be obtained.

The third embodiment of the present invention will be described below with reference to FIGS. 6A to 6D. FIGS. 6A to 6D are sectional views showing the steps in manufacturing a semiconductor laser device according to the third embodiment of the present invention in an order of manufacturing steps.

Figure 6A:
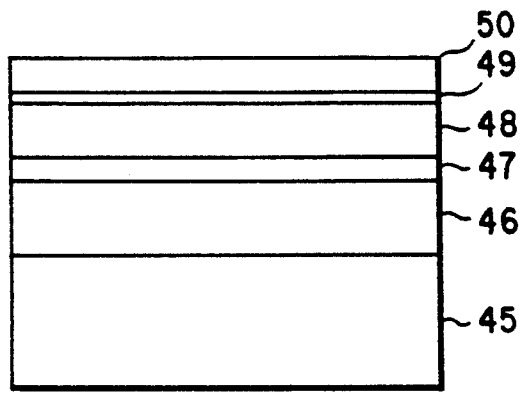
FIG. 6A is a sectional view showing the first step of the third embodiment of the present invention.

In the first step shown in FIG. 6A, trimethyl indium, trimethyl gallium, and trimethyl aluminum, phosphine, and arsine were used as source gases, and a pressure was decreased to be lower than the atmospheric pressure. In this state, an n-type $Ga_{0.6}Al_{0.4}As$ first cladding layer 46 having a thickness of 1.5 μm, an undoped $Ga_{0.88}Al_{0.12}As$ active layer 47 having a thickness of 0.05 μm, a p-type $Ga_{0.6}Al_{0.4}As$ second cladding layer 48 having a thickness of 0.2 μm, a p-type $In_{0.5}Ga_{0.5}P$ stopper layer 49 having a thickness of 0.01 μm, and a p-type $Ga_{0.8}Al_{0.2}As$ optical waveguide layer 50 having a thickness of 0.15 μm were continuously grown on an n-type GaAs semiconductor substrate 45 by an MOCVD method while the amounts of the source gases were controlled. In the third embodiment, in order to obtain an optical output having an oscillation wavelength different from that of the first embodiment, the materials used in the third embodiment are different from those in the first embodiment.

Figure 6B:
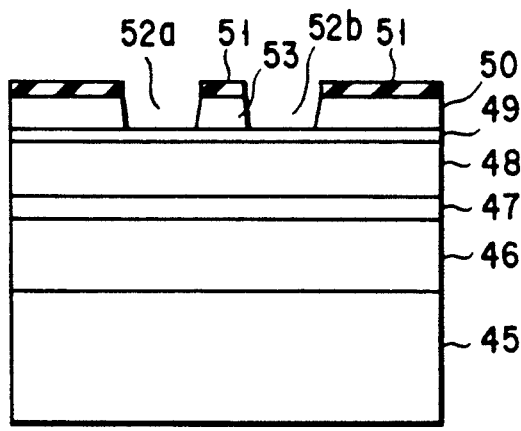
FIG. 6B is a sectional view showing the second step of the third embodiment of the present invention.

In the second step shown in FIG. 6B, an $SiO_2$ film 51 in which two stripe-like slits each having a width of 6 μm were formed at an interval having a width of 2 μm was formed on the upper surface of the p-type waveguide layer 50 formed in the first step, and the p-type optical waveguide layer 50 was selectively removed by a chemical etching operation using the $SiO_2$ film 51 as a mask until the p-type stopper layer 49 was exposed. Therefore, a stripe-like ridge 53 having a width of 2 μm was formed and had two stripe-like grooves 52a and 52b each having a width of 6 μm on both the sides of the ridge 53.

Figure 6C:
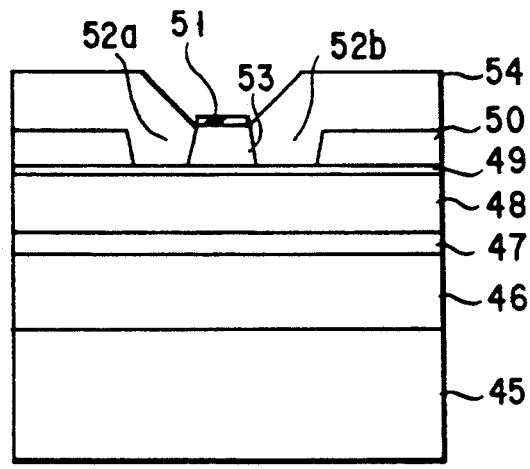
FIG. 6C is a sectional view showing the third step of the third embodiment of the present invention.

In the third step shown in FIG. 6C, the $SiO_2$ film 51 on the p-type waveguide layer 50 was removed to leave the $SiO_2$ film 51 on the ridge 53. Subsequently, by using a low pressure MOCVD method using the same source gases as those of the first step shown in FIG. 6A, an n-type $Ga_{0.6}Al_{0.4}As$ current blocking layer 54 having a thickness of 0.2 μm was epitaxially grown to leave the $SiO_2$ film 51 on the ridge 53 and to bury the grooves 52a and 52b.

Figure 6D:
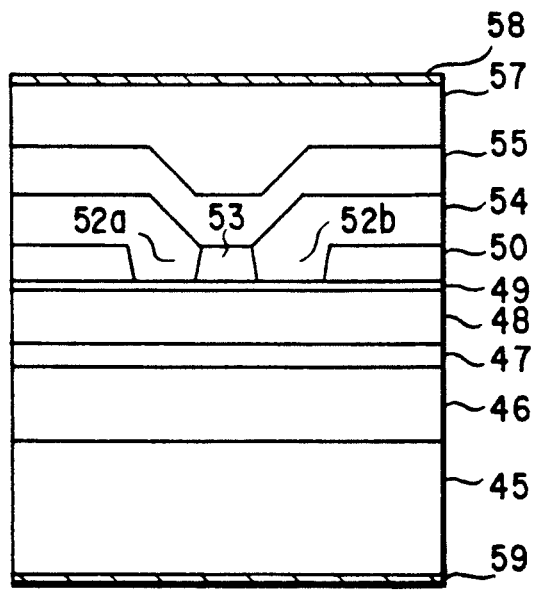
FIG. 6D is a sectional view showing the fourth step of the third embodiment of the present invention.

In the fourth step shown in FIG. 6D, after the $SiO_2$ film on the ridge 53 was removed, a p-type $Ga_{0.6}Al_{0.4}As$ third cladding layer 55 having a thickness of 1.5 μm and a p-type GaAs contact layer 57 having a thickness of 0.5 μm were epitaxially grown on the n-type current blocking layer 54 and the ridge 53 by the low pressure MOCVD method using the same source gases as those of the step shown in FIG. 6C. In the third embodiment, the p-type intermediate layer 36 formed in the first and second embodiments was omitted. A p-side electrode 58 and an n-side electrode 59 were formed on the upper surface of the p-type contact layer 57 and the lower surface of the n-type semiconductor substrate 45 by deposition, respectively, thereby forming a laser wafer. In addition, a square laser having a side of 300 μm was obtained from the obtained wafer in which a cleavage surface was used as a mirror surface.

In the laser device manufactured in the above steps, as in the laser device of the first embodiment, when the ridge serving as an optical waveguide is to be formed, the dimensions such as the height and width of the ridge 53 can be controlled with high precision. The thicknesses of the layers such as the p-type optical waveguide layer 50 can be controlled with high precision. In addition, when the n-type current blocking layer 54 is epitaxially grown, crystal defects are not concentrated near the ridge 53. Furthermore, since the n-type current blocking layer 54 is not made of GaAs but of a material transparent to a laser beam, a real index guided structure is formed, and laser characteristic values can fall within a sufficiently allowable range.

According to the third embodiment, a laser beam having a wavelength of 780 nm band is oscillated at a threshold current of 20 mA, although a conventional laser beam having a wavelength of 780 nm band is oscillated at a threshold current of 30 mA. In a conventional laser beam, a transverse mode having one peak can be maintained until an output becomes about 20 mW. However, according to the first embodiment, a transverse mode having one peak can be maintained until an output becomes 25 mW. In this embodiment, since the real index guided structure is used, a small astigmatism of 2 μm or less can be obtained, although a conventional astigmatism is 8 μm. In temperature characteristics and reliability, the laser device of the third embodiment can be improved compared with a conventional laser device. In addition, in the laser device of the third embodiment, uniformity in the wafer surface and reproducibility of the processes are improved compared with those of a conventional laser device.

Figure 7C:
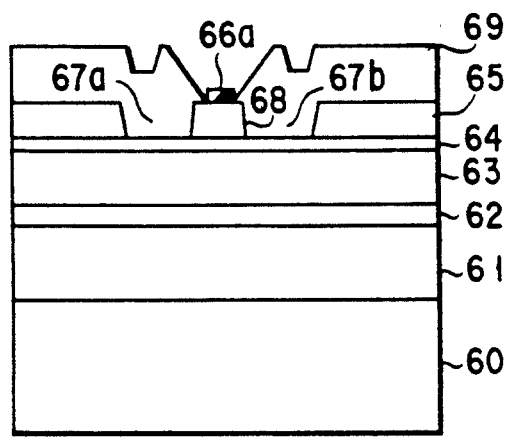
FIG. 7C is a sectional view showing the third step of the fourth embodiment of the present invention.

The fourth embodiment of the present invention will be described below with reference to FIGS. 7A to 7B. FIGS. 7A to 7D are sectional views showing the steps in manufacturing a semiconductor laser device according to the fourth embodiment of the present invention in an order of manufacturing steps.

In the first step shown in FIG. 7A, trimethyl indium, trimethyl gallium, and trimethyl aluminum, and phosphine were used as source gases, and a pressure was decreased to be lower than the atmospheric pressure. In this state, an n-type $In_{0.5}(Ga_{0.3}Al_{0.7})_{0.5}P$ first cladding layer 61 having a thickness of 0.8 μm, an undoped $In_{0.5}(Ga_{1-x}Al_x)_{0.5}P$ active layer 62 having a thickness of 0.03 μm, a p-type $In_{0.5}(Ga_{0.3}Al)_{0.5}P$ second cladding layer 63 having a thickness of 0.2 μm, a p-type $In_{0.5}Ga_{0.5}P$ stopper layer 64 having a thickness of 0.01 μm, and a p-type $In_{0.5}(Ga_{1-y}Al_y)_{0.5}P$ optical waveguide layer 65 having a thickness of 0.15 μm were continuously grown on an n-type GaAs semiconductor substrate 60 by an MOCVD method while the amounts of the source gases were controlled. Note that the values x and y are set to be the values x and y in the first embodiment.

In the second step shown in FIG. 7B, an $SiO_2$ film 66 in which two stripe-like slits each having a width of 8 $\mu m$ were formed at a 4-$\mu m$ interval was formed on the upper surface of the p-type waveguide layer 65 formed in the first step, and the p-type optical waveguide layer 65 was selectively removed by a chemical etching operation using this $SiO_2$ film 66 as a mask until the p-type stopper layer 64 was exposed. Therefore, a stripe-like ridge 68 having a width of 4 $\mu m$ was formed on the p-type optical waveguide layer 65, and two stripe-like grooves 67a and 67b each having a width of 8 $\mu m$ were formed on both the sides of the ridge 68. In the fourth embodiment, a refractive index difference between the ridge 68 and the active layer 62 was set to be large.

In the third step shown in FIG. 7C, the $SiO_2$ film 66 on the p-type waveguide layer 65 was removed to leave the $SiO_2$ film 66 on the ridge 68 as a stripe-like $SiO_2$ film 66a having a width of 2 $\mu m$. Subsequently, by using a low pressure MOCVD method using the same source gases as those of the first step shown in FIG. 7A, an n-type $In_{0.5}(Ga_{0.3}Al_{0.7})_{0.5}P$ current blocking layer 69 having a thickness of 0.2 $\mu m$ was epitaxially grown on the upper surface of the p-type optical waveguide layer 65 to leave the $SiO_2$ film 66a on the ridge 68 and to bury the grooves 67a and 67b. The width of a conductive region 73 of FIG. 7D in the fourth embodiment was set to be smaller than that of each of the above embodiments because the $SiO_2$ film 66a was formed.

Figure 7D:
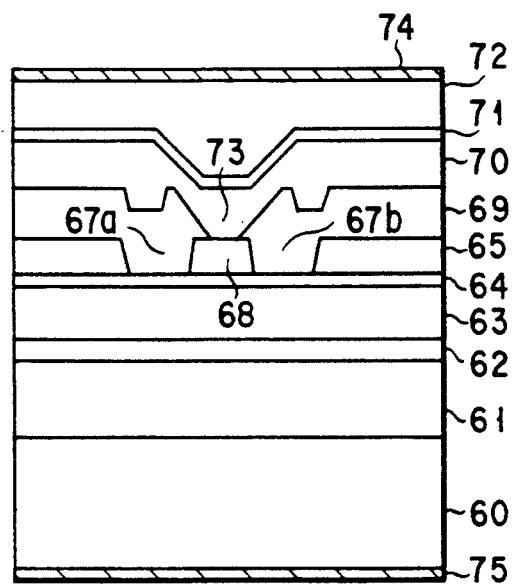
FIG. 7D is a sectional view showing the fourth step of the fourth embodiment of the present invention.

In the fourth step shown in FIG. 7D, after the $SiO_2$ film 66a on the ridge 68 was removed, a p-type $In_{0.5}(Ga_{0.3}Al_{0.7})_{0.5}P$ third cladding layer 70 having a thickness of 0.9 $\mu m$ and a p-type $IN_{0.5}Ga_{0.5}P$ intermediate layer 71 having a thickness of 0.05 $\mu m$ were epitaxially grown on the n-type current blocking layer 69 and the ridge 68 by the low pressure MOCVD method using the same source gases as those of the step shown in FIG. 7C. Subsequently, a p-type GaAs contact layer 72 having a thickness of 0.5 $\mu m$ was epitaxially grown on the p-type intermediate layer 71 by a low pressure MOCVD method using trimethyl gallium and arsine. Note that the conductive region 73 having a width of 2 $\mu m$ was formed on the upper surface of the ridge 68 having the thickness of 4 $\mu m$ along the longitudinal direction of the ridge 68. A p-side electrode 74 and an n-side electrode 75 were formed on the upper surface of the p-type contact layer 72 and the lower surface of the n-type semiconductor substrate 45 by deposition, respectively, thereby forming a laser wafer. In addition, a square laser having a side of 300 $\mu m$ was obtained from the obtained wafer in which a cleavage surface having the (1,1,0) plane was used as a mirror surface.

Figure 8:
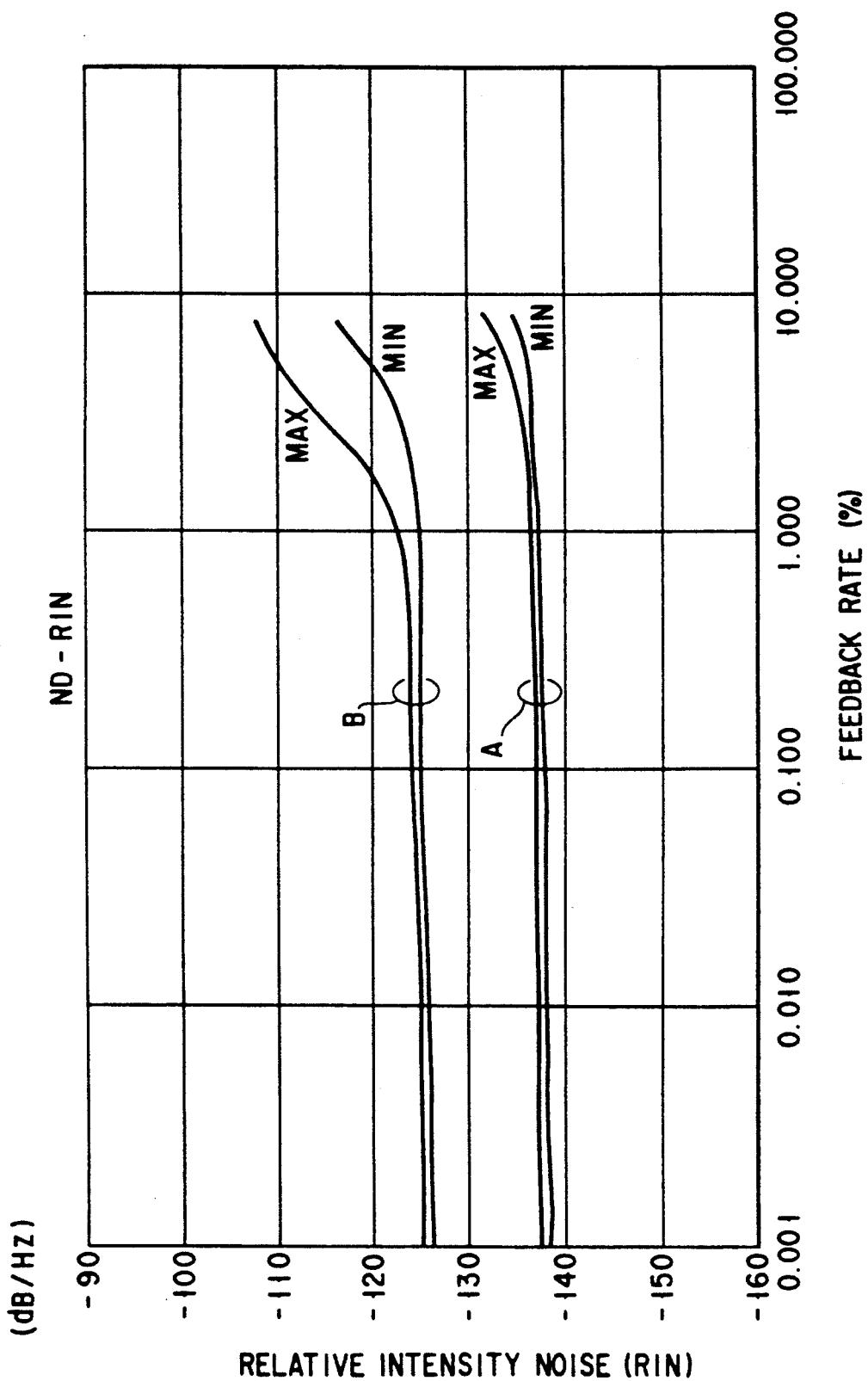
FIG. 8 is a graph showing a characteristic curve representing an optical feedback rate vs. relative intensity noise according to the fourth embodiment of FIG. 7.

In the laser device manufactured in the above steps, as in the laser device of the first embodiment, when the ridge 68 serving as an optical waveguide is to be formed, the dimensions such as the height and width of the ridge 68 can be controlled with high precision. The thicknesses of the layers such as the p-type optical waveguide layer 65 can be controlled with high precision. In addition, when the n-type current blocking layer 69 is epitaxially grown, crystal defects are not concentrated near the ridge 68. Furthermore, since the n-type current blocking layer 69 is not made of GaAs but of a material transparent to a laser beam, a real index guided structure is formed, and laser characteristic values can fall within a sufficiently allowable range. Since the width of the conductive region 73 is set to be smaller than that of the ridge 68, a range in which a transverse mode is established is set to be smaller than that of current distribution to cause self-excited oscillation. Therefore, as shown in FIG. 8, excellent optical feedback noise characteristics can be obtained. In FIG. 8, curves A indicate the characteristics of the laser device according to the fourth embodiment of the present invention, and curves B indicate the characteristics of a conventional laser device.

According to the fourth embodiment, a laser beam having a wavelength of 670 nm band is oscillated at a threshold current of 30 mA, although a conventional laser beam having a wavelength of 670 nm band is oscillated at a threshold current of 40 mA. In a conventional laser beam, a transverse mode having a single maximum can be maintained until an output becomes about 10 mW. However, according to the fourth embodiment, a transverse mode having a single maximum can be maintained until an output becomes 20 mW. In this embodiment, since the real index guided structure is used, a small astigmatism of 2 $\mu m$ or less can be obtained, although a conventional astigmatism is 5 $\mu m$ or more. In conventional temperature characteristics, a 10-mW optical output can be obtained at a temperature of 70° C. However, in the fourth embodiment, a 20-mW optical output can be obtained at a temperature of 70° C. In reliability, a failure rate of the laser device of the fourth embodiment is half a failure rate of a conventional laser device. In addition, according to the fourth embodiment, uniformity in the wafer surface and reproducibility of the processes are improved compared with those of a conventional laser device. Furthermore, in this embodiment, a longitudinal multi-mode is set by self-excited oscillation, and optical feedback noise characteristics are excellent in which a relative intensity noise of $-130$ dB/Hz to $-120$ dB/Hz can be obtained when 5% optical feedback is set. Therefore, the laser device can be used in an optical disk system such as a video disk.

FIG. 9 is a sectional view showing the fifth embodiment of the present invention. The fifth embodiment is different from the fourth embodiment in an arrangement of a ridge formed on an optical waveguide layer. The same reference numerals as in the fourth embodiment denote the same parts in the fifth embodiment. In FIG. 9, reference numeral 76 denotes a p-type optical waveguide layer having a thickness of 0.15 $\mu m$ and the same composition as that of the fourth embodiment, and the p-type optical waveguide layer 76 was divided into a lower layer 76a and an upper layer 76b by forming a p-type stopper layer 76 having a thickness of 0.01 $\mu m$ and the same composition as that of the fourth embodiment therebetween. The p-type optical waveguide layer 76 was formed as follows. That is, an n-type first cladding layer 61, an active layer 62, and a p-type second cladding layer 63 were epitaxially grown on an n-type semiconductor substrate 60 in the same manner as that of the fourth embodiment, and the lower layer 76a, the p-type stopper layer 77, and the upper layer 76b are sequentially formed on the upper surface of the p-type second cladding layer. A stripe-like ridge 79 having a width of 4 $\mu m$ was formed on the upper layer 76b of the p-type optical waveguide layer 76, and two stripe-like grooves 78a and 78b each having a width of 8 $\mu m$ were formed on both the sides of the ridge 79. This ridge 79 was formed as follows. As in the step shown in FIG. 7B, a predetermined mask was formed on the upper surface of the upper layer 76b, and the upper layer 76b was etched from its upper surface to the p-type stopper layer 77 to form the grooves 78a and 78b. Note that the upper layer 76b was formed to have a thickness set within a range in which an appropriate small refractive rate difference could be obtained when the ridge 79 was used as an optical waveguide, i.e., the upper layer 76b had the thickness of 0.01 μm or more. Thereafter, as in the steps of the fourth embodiments, an n-type current blocking layer 80 having a thickness of 0.2 μm and the same composition as that of the fourth embodiment was epitaxially grown on the upper surface of the p-type optical waveguide layer 76 on which the ridge 79 and the grooves 78a and 78b were formed. The n-type current blocking layer 80 was not grown on the upper surface of the ridge 79. In addition, the p-type third cladding layer 70 and the p-type intermediate layer 71 were epitaxially grown on the n-type current blocking layer 80 and the ridge 79, the p-type contact layer 72 was formed on the p-type intermediate layer 71, and a p-side electrode 74 and an n-type electrode 75 were formed by deposition. The resultant structure was cleved to obtain a square laser having a side of 300 μm.

In this embodiment, the ridge 79 can be formed to suppress an increase in refractive rate difference, and the same function and effect as described in the fourth embodiment can be obtained.

The sixth embodiment of the present invention will be described below with reference to FIGS. 10A to 10D. FIGS. 10A to 10D are sectional views showing the steps in manufacturing a semiconductor laser device according to the sixth embodiment of the present invention in an order of manufacturing steps.

In the first step shown in FIG. 10A, trimethyl indium, trimethyl gallium, and trimethyl aluminum, phosphine, and arsine were used as source gases, and a pressure was decreased to be lower than the atmospheric pressure. In this state, an n-type $Ga_{0.6}Al_{0.4}As$ first cladding layer 82 having a thickness of 1.5 μm, an undoped $Ga_{0.88}Al_{0.12}As$ active layer 83 having a thickness of 0.05 μm, a p-type $Ga_{0.6}Al_{0.4}As$ second cladding layer 84 having a thickness of 0.2 μm, a p-type $In_{0.5}Ga_{0.5}P$ stopper layer 85 having a thickness of 0.01 μm, and a p-type $Ga_{0.8}Al_{0.2}As$ optical waveguide layer 86 were continuously grown on an n-type GaAs semiconductor substrate 81 by an MOCVD method while the amounts of the source gases were controlled. In the sixth embodiment, the materials used for these layer and the components thereof were different from those of the first to fifth embodiments.

In the second step shown in FIG. 10B, an $SiO_2$ film 87 in which two stripe-like slits each having a width of 8 μm were formed at an interval having a width of 4 μm was formed on the upper surface of the p-type waveguide layer 86 formed in the first step, and the p-type optical waveguide layer 86 was selectively removed by a chemical etching operation using the $SiO_2$ film 78 as a mask until the p-type stopper layer 85 was exposed. Therefore, a stripe-like ridge 89 having a width of 4 μm was formed on the p-type optical waveguide layer 86 and had two stripe-like grooves 88a and 88b each having a width of 8 μm on both the sides of the ridge 89.

Figure 10C:
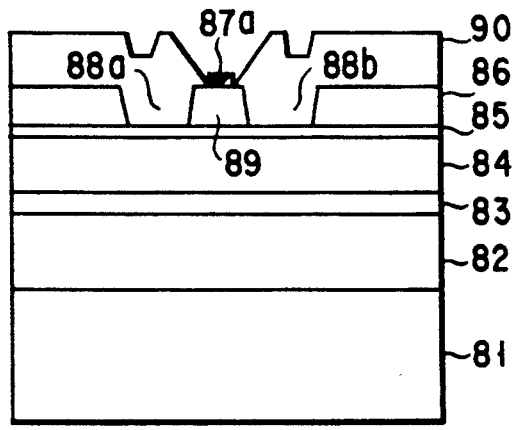
FIG. 10C is a sectional view showing the third step of the sixth embodiment of the present invention.

In the third step shown in FIG. 10C, the $SiO_2$ film 87 on the p-type waveguide layer 86 was removed to leave the $SiO_2$ film 87 on the ridge 89 as a stripe-like $SiO_2$ film 87a. Subsequently, by using a low pressure MOCVD method using the same source gases as those of the first step shown in FIG. 10A, an n-type $Ga_{0.6}Al_{0.4}As$ current blocking layer 90 having a thickness of 0.2 μm was epitaxially grown on the upper surface of the p-type optical waveguide layer 86 to leave an $SiO_2$ film 87a on the ridge 89 and to bury the grooves 88a and 88b.

Figure 10D:
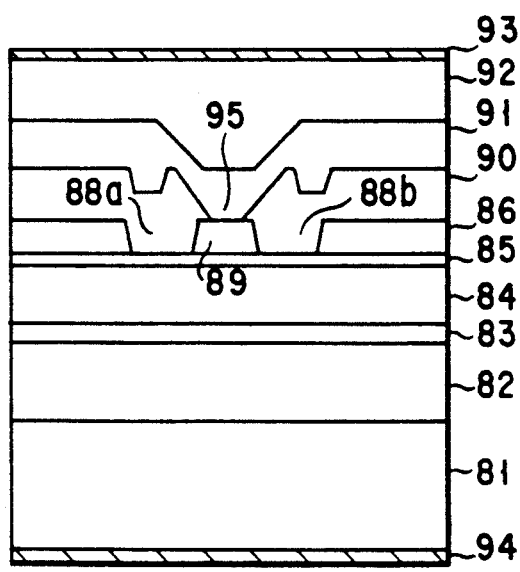
FIG. 10D is a sectional view showing the fourth step of the sixth embodiment of the present invention.

In the fourth step shown in FIG. 10D, after the $SiO_2$ film 87a on the ridge 89 was removed, a p-type $Ga_{0.6}Al_{0.4}As$ third cladding layer 91 having a thickness of 1.5 μm and a p-type GaAs contact layer 92 having a thickness of 0.5 μm were epitaxially grown on the n-type current blocking layer 90 and the ridge 89 by the low pressure MOCVD method using the same source gases as those of the step shown in FIG. 10C. A p-side electrode 93 and an n side electrode 94 were formed on the upper surface of the p-type contact layer 92 and the lower surface of the n-type semiconductor substrate 81 by deposition, respectively, thereby forming a laser wafer. In addition, a square laser having a side of 300 μm was obtained from the obtained wafer in which a cleavage surface was used as a mirror surface. Note that a conductive layer 95 having a width of 2 μm was formed on the upper surface of the ridge 89 having a width of 4 μm along the longitudinal direction of the ridge 89.

In the laser device manufactured in the above steps, as in the laser device of the fourth embodiment, when the ridge 89 is to be formed, the dimensions such as the height and width of the ridge 89 can be controlled with high precision. The thicknesses of the layers such as the p-type optical waveguide layer 86 can be controlled with high precision. In addition, when the n-type current blocking layer 90 is epitaxially grown, crystal defects are not concentrated near the ridge 89. Furthermore, since the n-type current blocking layer 90 is not made of GaAs but of a material transparent to a laser beam, a real index guided structure is formed, and laser characteristic values can fall within a sufficiently allowable range. Since the width of a conductive region 95 is set to be smaller than that of the ridge 89, a range in which a transverse mode is established is set to be smaller than that of current distribution to cause self-excited oscillation, and excellent optical feedback noise characteristics can be obtained.

According to the sixth embodiment, a laser beam having a wavelength of 780 nm band is oscillated at a threshold current of 25 mA, although a conventional laser beam having a wavelength of 780 nm band is oscillated at a threshold current of 35 mA. In a conventional laser beam, a transverse mode having a single maximum can be maintained until an output becomes about 20 mW. However, according to the sixth embodiment, a transverse mode having a single maximum can be maintained until an output becomes 25 mW. In this embodiment, since the real index guided structure is used, a small astigmatism of 2 μm or less can be obtained, although a conventional astigmatism is 5 μm or more. The laser device of the sixth embodiment is improved compared with a conventional laser device in temperature characteristics and reliability. In addition, according to the sixth embodiment, uniformity in the wafer surface and reproducibility of the processes are improved compared with those of a conventional laser device. In this embodiment, a longitudinal multi-mode is set by self-excited oscillation, and optical feedback noise characteristics are excellent in which a relative intensity noise of −130 dB/Hz to −120 dB/Hz can be obtained when 5% optical feedback return light is set.

The laser device can be used in a video disk. In addition, according to the sixth embodiment, uniformity in the wafer surface and reproducibility of the processes are improved compared with those of a conventional laser device.

Figure 11:
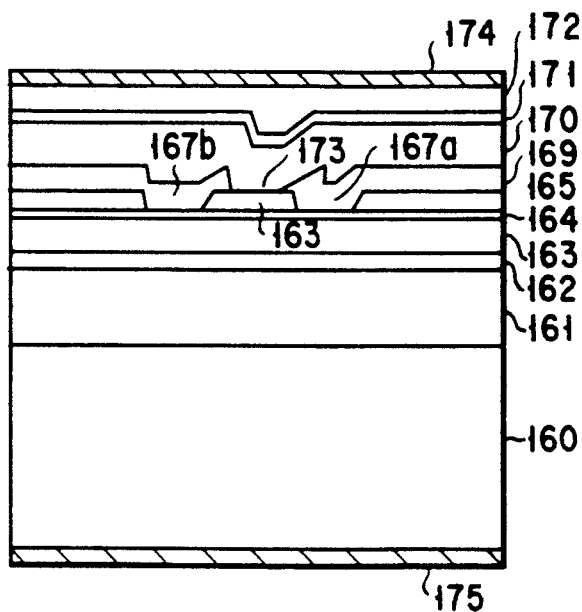
FIG. 11 is a sectional view showing an index guided semiconductor laser device according to the seventh embodiment of the present invention.

FIG. 11 is a sectional view showing a laser device according to the seventh embodiment of the present invention. The seventh embodiment is different from the fourth embodiment as follows. That is, the plane direction of an n-type semiconductor substrate 160 is inclined from the direction (0,0,1) to the direction [1,1,0] by an angle of 15°, and layers are formed on the upper surface of the inclined n-type semiconductor substrate 160 by the same materials and manufacturing steps as those of the fourth embodiment. The manufacturing steps are performed as follows. In FIG. 11, an n-type first cladding layer 161, an active layer 162, a p-type second cladding layer 163, and a p-type stopper layer 164, and a p-type optical waveguide layer 165 were continuously grown on the n-type semiconductor substrate 160 while amounts of materials for these layers were controlled. Thereafter, a mask in which two stripe-like slits were formed was arranged on the upper surface of the p-type optical waveguide layer 165, and the p-type optical waveguide layer 165 was selectively etched to form a stripe-like ridge 168 having two stripe-like grooves 167a and 167b on both the sides of the ridge 168. The mask on the ridge 168 was left as a narrow stripe-like mask, and an n-type current blocking layer 169 was epitaxially grown. Subsequently, after the mask on the ridge 168 was removed, a p-type third cladding layer 170, a p-type intermediate layer 171, and a p-type GaAs contact layer 172 were epitaxially grown on the n-type current blocking layer 169 and the ridge 168, thereby forming a narrow conductive region 173 on the upper surface of the ridge 168 along the longitudinal direction thereof. A p-side electrode 174 and an n-side electrode 175 were formed on the upper surface of the p-type contact layer 172 and the lower surface of the n-type semiconductor substrate 160 by deposition, respectively, to form a laser wafer. In addition, a square laser having a side of 300 μm was obtained from the obtained wafer in which a cleavage surface having the (1,1,0) plane was used as a mirror surface.

In the laser device manufactured in the above steps, since the ridge 168 can be formed to have a small height, although the ridge 168 is formed on the upper surface of the inclined n-type semiconductor substrate 160, the shape of the ridge 168 is kept to be symmetrical in the right-and-left direction within an allowance range of refractive rate distribution. Therefore, a band gap is increased, and an oscillation wavelength can be shortened. At the same time, a transverse mode is kept to be stable up to a high output, a characteristic curve representing current vs. optical output characteristics is not kinked, and a far field pattern is not changed. The same function and effect as described in the fourth embodiment can be obtained. For example, when the n-type current blocking layer 169 is epitaxially grown, crystal defects are not concentrated near the ridge 168. In addition, a short oscillation wavelength can be obtained, and laser characteristic values fall within a sufficiently allowable range. The width of the conductive region 173 is set to be smaller than that of the ridge 168, self-excited oscillation can be generated by setting a range of current distribution to be narrower than a range in which a transverse mode is established, and excellent optical feedback noise characteristics can be obtained.

According to the seventh embodiment, a laser device of a wavelength of, e.g., 650 nm band, is oscillated at a threshold current of 30 mA, a transverse mode having a single maximum can be maintained until an output power becomes 20 mW. In this embodiment, since the real index guided structure is used, a small astigmatism of 2 μm or less can be obtained. In temperature characteristics, a 20-mW optical output can be obtained at a temperature of 70° C. In reliability, a failure rate of the laser device of the seventh embodiment is half a failure rate of a conventional laser device. In this embodiment, a longitudinal multi-mode is set by self-excited oscillation, and, feedback noise characteristics are excellent in which a relative intensity noise of −130 dB/Hz to −120 dB/Hz can be obtained when 5% optical feedback is set. Even when a laser device having the same component as that of the laser device having an oscillation wavelength of 670 nm band is used, the wavelength of the beam generated from the laser device can be shortened by 20 μm, and the laser device can be used in an optical disk system and the like having a higher recording density.

As is apparent from the above description, according to the present invention, since a ridge serving as an optical waveguide is formed such that grooves adjacent to the ridge are formed along both the longitudinal sides of the ridge, the following effect can be obtained. That is, the ridge can be formed with high precision, crystallinity of a current blocking layer near the ridge is improved, and desired laser characteristics can be obtained with excellent uniformity and reproducibility, thereby improving the reliability of the laser device.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor laser device comprising:
   a semiconductor substrate of a first conductivity type;
   a first cladding layer of the first conductivity type, an undoped active layer having a predetermined thickness, and a second cladding layer of a second conductivity type, which are sequentially formed on said semiconductor substrate of the first conductivity type;
   an optical waveguide layer of the second conductivity type formed on an upper surface of said second cladding layer of the second conductivity type to have a predetermined thickness and having two parallel stripe-like slits which are formed at a central portion of said second cladding layer and each of which has a predetermined width, said two parallel stripe-like slits exposing said second cladding layer of the second conductivity type and defining a ridge therebetween;
   a current blocking layer of the first conductivity type formed on a surface of the resultant structure except for an upper surface of said ridge;
   a third cladding layer of the second conductivity type formed on the upper surface of said ridge and a surface of said current blocking layer of the first conductivity type; and
   a first electrode means formed on a lower surface of said semiconductor substrate and a second electrode means formed on the upper surface of said third cladding layer through a contact layer formed on said third cladding layer.

2. A device according to claim 1, wherein said ridge is formed to have a height of not more than 0.3 μm.

3. A device according to claim 1, further comprising an intermediate layer of the second conductivity type formed between said third cladding layer of the second conductivity type and said contact layer of the second conductivity type.

4. A semiconductor laser device comprising:
an n-type GaAs semiconductor substrate:
an n-type $In_{0.5}(Ga_{0.3}Al_{0.7})_{0.5}P$ first cladding layer, an undoped $In_{0.5}(Ga_{1-x}Al_x)_{0.5}P$ active layer having a predetermined thickness, a p-type $In_{0.5}(Ga_{0.3}Al_{0.7})_{0.5}P$ second cladding layer, a p-type $In_{0.5}Ga_{0.5}P$ stopper layer which are sequentially formed on said semiconductor substrate;
a p-type $In_{0.5}(Ga_{1-y}Al_y)_{0.5}P$ optical waveguide layer formed on an upper surface of said stopper layer to have a predetermined thickness and having two parallel stripe-like slits formed at a central portion of said optical waveguide layer, said parallel slits having a ridge having a predetermined width and defined therebetween;
a n-type $In_{0.5}(Ga_{0.3}Al_{0.7})_{0.5}P$ current blocking layer formed on a surface of the resultant structure except for an upper surface of said ridge;
a p-type $In_{0.5}(Ga_{0.3}Al_{0.7})_{0.5}P$ third cladding layer, a p-type $In_{0.5}Ga_{0.5}P$ intermediate layer, and a p-type GaAs contact layer which are sequentially formed on an upper surface of said current blocking layer; and
an n-type electrode and a p-type electrode which are formed on a surface of said semiconductor substrate and a surface of said contact layer, respectively.

5. A semiconductor laser device comprising:
a semiconductor substrate of a first conductivity type;
a first cladding layer of the first conductivity type, an undoped active layer having a predetermined thickness, and a second cladding layer of a second conductivity type, which are sequentially formed on said semiconductor substrate of the first conductivity type;
an optical waveguide layer of the second conductivity type formed on an upper surface of said second cladding layer of the second conductivity type to have a predetermined thickness and having two parallel stripe-like slits each having a predetermined depth in said optical waveguide layer of the second conductivity type and formed at a central portion of said second cladding layer, said two parallel stripe-like slits defining a ridge therebetween;
a current blocking layer of the first conductivity type formed on a surface of the resultant structure except for an upper surface of said ridge;
a third cladding layer of the second conductivity type formed on an upper surface of said ridge and a surface of said current blocking layer of the first conductivity type;
an intermediate layer of the second conductivity type and a contact layer of the second conductivity type sequentially formed on an upper surface of said third cladding layer of the second conductivity type; and first and second electrodes arranged on a surface of said semiconductor substrate of the first conductivity type and a surface of said contact layer of the second conductivity type, respectively.

6. A device according to claim 5, wherein a predetermined depth of each of said parallel slits is not less than 0.01 μm.

7. A semiconductor laser device comprising:
an n-type GaAs semiconductor substrate;
an n-type $Ga_{1-y}Al_yAs$ first cladding layer, an undoped $Ga_{1-x}Al_xAs$ active layer having a predetermined thickness, a p-type $Ga_{1-y}Al_yAs$ second cladding layer, and a p-type $In_{0.5}Ga_{0.5}P$ stopper layer which are sequentially formed on said semiconductor substrate;
a p-type $Ga_{1-z}Al_zAs$ optical waveguide layer formed on an upper surface of said stopper layer to have a predetermined thickness and having two parallel stripe-like slits formed at a central portion of said optical waveguide layer, said parallel slits having a ridge having a predetermined width and defined therebetween;
an n-type $Ga_{1-w}Al_wAs$ current blocking layer formed on a surface of the resultant structure except for an upper surface of said ridge;
a p-type $Ga_{1-y}Al_yAs$ third cladding layer and a p-type GaAs contact layer sequentially formed on an upper surface of said current blocking layer; and
an n-side electrode and a p-side electrode which are formed on a surface of said semiconductor substrate and a surface of said contact layer, respectively.

8. A semiconductor laser device comprising:
a semiconductor substrate of a first conductivity type;
a first cladding layer of the first conductivity type, an undoped active layer having a predetermined thickness, and a second cladding layer of a second conductivity type, which are sequentially formed on said semiconductor substrate of the first conductivity type;
an optical waveguide layer of the second conductivity type formed on an upper surface of said second cladding layer of have a predetermined thickness and having two parallel stripe-like slits formed at a central portion of said optical waveguide layer, said parallel slits having a ridge having a predetermined width and defined therebetween;
a current blocking layer of the first conductivity type formed on entire surfaces of said ridge, said parallel slits, and said optical waveguide layer of the second conductivity type except for stripe regions of an upper surface of said ridge;
a third cladding layer of the second conductivity type formed on a surface of said stripe regions of said ridge and on a surface of said current blocking layer of the first conductivity type;
an contact layer of the second conductivity type formed on an upper surface of said third cladding layer of the second conductivity type; and
first and second electrodes arranged on a surface of said semiconductor substrate of the first conductivity type and a surface of said contact layer of the second conductivity type, respectively.

9. A device according to claim 8, wherein said ridge is formed to have a height of not more than 0.3 μm.

10. A device according to claim 8, further comprising an intermediate layer of the second conductivity type formed between said third cladding layer of the second conductivity type and said contact layer of the second conductivity type.

11. A device according to claim 8, wherein a plane direction of said semiconductor substrate of the first conductivity type is inclined from a direction (0,0,1) to a direction [1,1,0] by a predetermined angle.

12. A semiconductor laser device comprising:
a semiconductor substrate of a first conductivity type;
a first cladding layer of the first conductivity type, an undoped active layer having a predetermined thickness, and a second cladding layer of a second conductivity type, which are sequentially formed on said semiconductor substrate of the first conductivity type;
a lower optical waveguide layer of the second conductivity type formed on an upper surface of said second cladding layer of the second conductivity type to have a predetermined thickness;
a stopper layer of the second conductivity type formed on an upper surface of said lower optical waveguide layer of the second conductivity type;
an upper optical waveguide layer of the second conductivity type formed on an upper surface of said stopper layer of the second conductivity type to have a predetermined thickness, having the same composition as that of said lower optical waveguide layer of the second conductivity type, and having two parallel stripe-like slits which are formed at a central portion of said second cladding layer and each of which has a predetermined width, said two parallel stripe-like slits exposing said lower optical waveguide layer of the second conductivity type and having a ridge defined therebetween;
a current blocking layer of the first conductivity type formed on all surfaces of said ridge, said parallel slits, and said upper optical waveguide layer of the second conductivity type except for stripe regions of an upper surface of said ridge;
a third cladding layer of the second conductivity type formed on a surface of said stripe regions of said ridge and on a surface of said current blocking layer of the first conductivity type;
a contact layer of the second conductivity type formed on an upper surface of said third cladding layer of the second conductivity type; and
first and second electrodes arranged on a surface of said semiconductor substrate of the first conductivity type and a surface of said contact layer of the second conductivity type, respectively.

13. A device according to claim 12, wherein said ridge is formed to have a height of not more than 0.3 μm.

14. A device according to claim 12, further comprising an intermediate layer of the second conductivity type formed between said third cladding layer of the second conductivity type and said contact layer of the second conductivity type.

* * * * *

UNITED STATES PATENT AND TRADEMARK OFFICE
CERTIFICATE OF CORRECTION

PATENT NO. : 5,289,487
DATED : February 22, 1994
INVENTOR(S) : Naohiro Shimada

It is certified that error appears in the above-indentified patent and that said Letters Patent is hereby corrected as shown below:

Attorney, Agent, or Firm, title page, line 1, after "Henderson" insert --,--.

Claim 4, column 17, line 28, change "an" to --a--.

Claim 8, column 18, line 58, change "an" to --a--.

Signed and Sealed this

Eleventh Day of October, 1994

Attest:

BRUCE LEHMAN

Attesting Officer     Commissioner of Patents and Trademarks